United States Patent [19]

Peczalski

[11] Patent Number: 5,105,167
[45] Date of Patent: Apr. 14, 1992

[54] HARMONIC INJECTION AMPLIFIER

[75] Inventor: Andrzej Peczalski, Eden Prairie, Minn.

[73] Assignee: Honeywell Inc., Minneapolis, Minn.

[21] Appl. No.: 676,997

[22] Filed: Mar. 28, 1991

[51] Int. Cl.$^5$ .................. H03F 3/68; H03F 3/193; H03F 3/60
[52] U.S. Cl. ..................... 330/295; 330/286; 330/306
[58] Field of Search ............ 330/124 R, 277, 286, 330/287, 295, 302, 306

[56] References Cited

U.S. PATENT DOCUMENTS 4,692,714  9/1987  Galani ........................... 331/100 X
4,772,856  3/1991  Nojima et al. ................... 330/251

OTHER PUBLICATIONS

"High Efficiency Microwave Harmonic Reaction Amplifier" by T. Nojima and S. Nishiki in 1988 IEEE MTT-S Digest pp. 1007-1010.

"Harmonic Reaction Amplifier" by S. Nishiki and T. Nojima in 1987 IEEE MTT-S Digest pp. 963-966.

"A Theoretical Analysis and Experimental Confirmation of the Optimally Loaded and Overdriven RF Power Amplifier" by David M. Snider in IEEE Transactions on Electron Devices, vol. ED-14, No. 12, Dec. 1967, pp. 851-857.

Primary Examiner—Steven Mottola
Attorney, Agent, or Firm—John G. Shudy, Jr.

[57] ABSTRACT

An amplifier having band pass filters and resonators for injecting, mixing and downconverting, i.e., recycling, second and third harmonics to increase the amplifier's efficiency. Various aspects of amplifier design are developed for enhancing efficiency.

10 Claims, 12 Drawing Sheets

Enhancement mode amplifier

Depletion mode self-biased amplifier

HARMONIC INJECTION AMPLIFIER

FIELD OF THE INVENTION

The invention pertains to microwave amplifiers and particularly to high efficiency microwave amplifiers.

BACKGROUND OF THE INVENTION

Various theories of operation of high efficiency amplifiers have been developed over the years. However, microwave power amplifiers have only recently had maximum drain efficiencies exceeding 70 per cent. One approach in the related art has been utilizing phase shifted feedback. One of the obstacles to achieving high efficiency in amplifiers has been the nonlinearity of amplifier elements which have resulted in harmonics in the amplified signals. Particular management of the harmonics in the design of the amplifiers has an effect on the efficiency of the amplifiers.

There is a need for achieving high efficiency in amplifiers which are battery powered. Low losses are particularly critical in the high power circuits where the dissipated power not only drains the power source but often substantially increases the junction temperature of the device. High operational temperatures thereby lead to lower performance and lower reliability of the amplifiers.

A 100 per cent efficient amplifier can be achieved when the fundamental frequency at the output of the amplifier is terminated into a matched impedance. The odd harmonics are terminated into an open circuit and the even harmonics are short circuited. The concept is referred to as a class F amplifier. However, such scheme of obtaining high efficiency requires open and short circuits over many harmonics since the amplitudes of the higher harmonics may be rather substantial. For instance, the amplitude of the 9th harmonic of the ideal square waves is equal to 11 per cent of the fundamental frequency amplitude. Such wideband open and short circuit terminations with no losses and/or reflections for so many harmonics is impractical in the microwave frequency range.

SUMMARY OF THE INVENTION

The present invention is a low powered, high efficiency microwave amplifier that utilizes harmonic energy recapture. The second and third harmonics generated by transistors of the amplifier, which operate in a class B, AB or similar mode, are recycled and converted back to the fundamental frequency thereby increasing the efficiency of operation. The amplifier utilizes second and third harmonic resonators for combining and increasing the high harmonic amplitudes thereby increasing the conversion efficiency. The resonators store and convert the harmonics energy. The harmonics are combined and are injected back into the amplifying means to generate more fundamental frequency power via a mixing process. Utilization of four or more amplifying means enhances the mixing effect and increases the efficiency of the amplifier. The invention has amplifier architecture that downconverts harmonic energy for increasing efficiency. The required gain in output power are generated at low bias voltage and current (important for battery operation) by heterojunction bipolar transistors and/or mushroom gate Indium-based heterostructure transistors. Small size is achieved with high dielectric constant substrates and compact layouts of transmission lines. Power losses due to linear transistor or FET characteristic region and breakdown voltages are minimized by the choice of transistors and/or FETs and bias conditions.

DESCRIPTION OF THE PREFERRED EMBODIMENT

Figure 1:
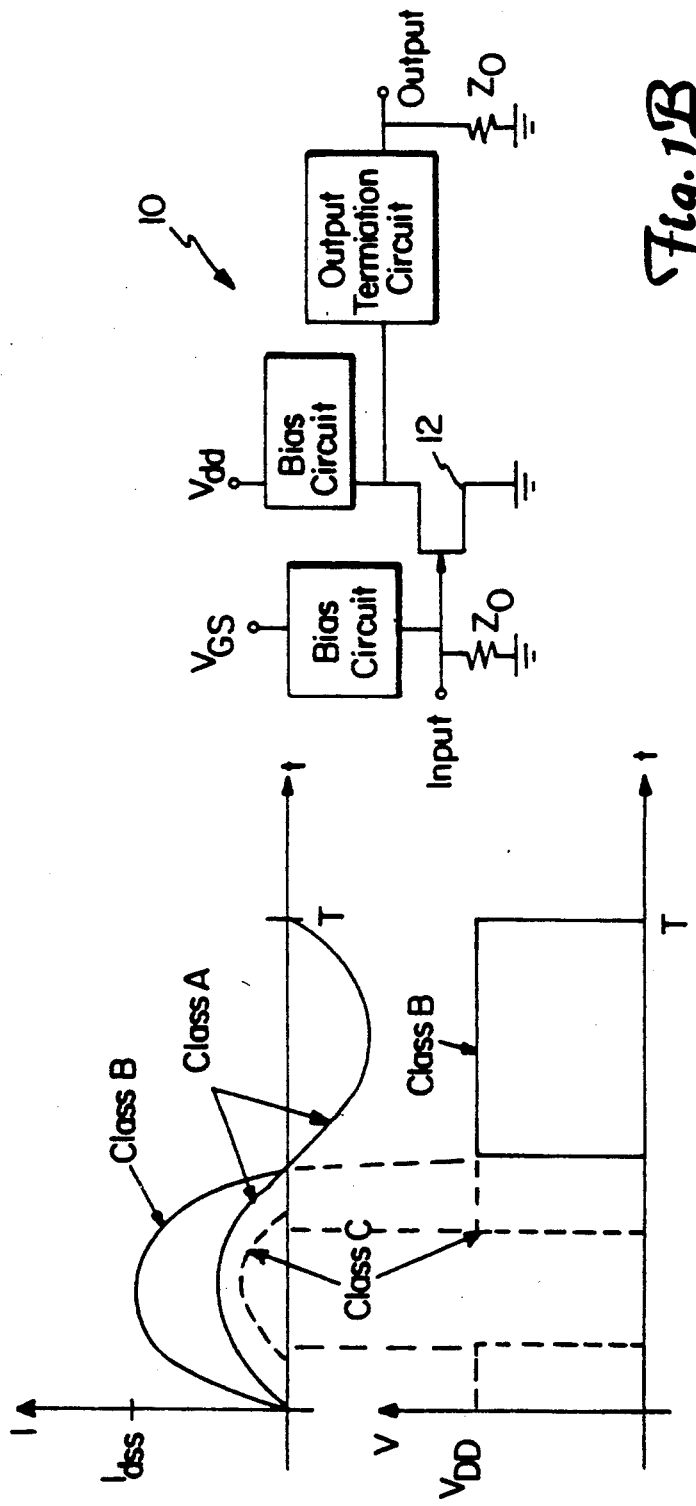
FIG. 1a reveals current and voltage waveforms for ideal amplifiers for various classes of operation, having an output matched for fundamental frequency, short circuited for even harmonics and open circuited for odd harmonics.
FIG. 1b is a schematic of an ideal amplifier having appropriate termination.
Figure 2:
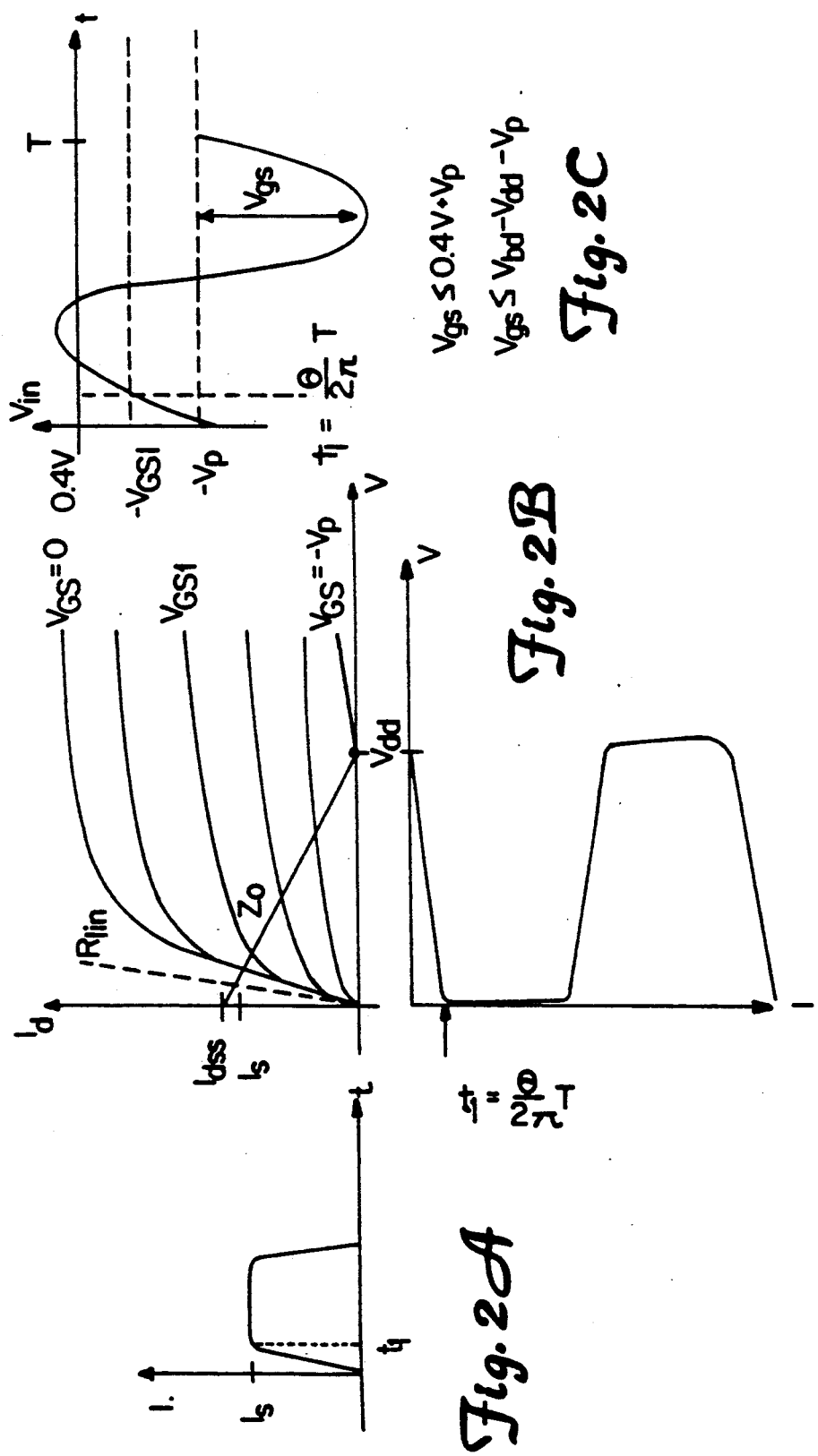
FIGS. 2a, 2b and 2c show a set of graphs revealing the operation of an overdriven FET.
Figure 3:
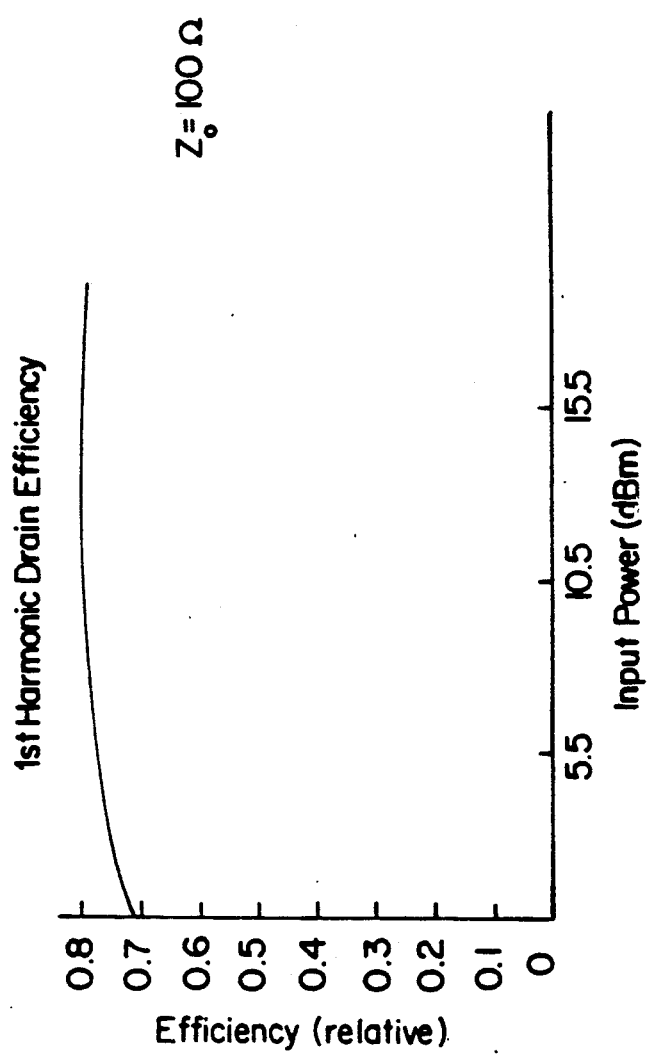
FIG. 3 reveals drain efficiency of a FET amplifier as a function of input power for an output impedance of 100 ohms.

It should be noted that compression (i.e., clipping) of amplifier output waveforms results in an increase in efficiency. However, the efficiency of perfectly square current and voltage wave forms can asymptotically reach only 81 per cent. Waveform compression is a significant efficiency-increasing technique. FIG. 1a shows the current waveforms for amplification classes A, B and C and their corresponding resultant voltage waveforms for classes B and C, respectively. The resultant square-waveforms of FIG. 1a are obtained by compression in amplifier 10 of FIG. 1b. Amplifier 10 represents the ideal amplifier having the output matched for the fundamental frequency, short circuited for even harmonics and open circuited for odd harmonics. FIG. 2 shows the waveforms for an over-driven FET 12. FIG. 2 graphically represents design guides for the high efficiency operation of over-driven FET 12.

Waveform compression is caused by a judicious choice of the FET 12 size and the load, i.e., matching impedance $Z_o \cdot Z_o = V_{dd}/I_{dss}$, where $V_{dd}$ is the bias voltage and $I_{dss}$ is the saturation current at the gate voltage $V_{in} = V_{GS1}$. The gate voltage $V_{GS1}$ determines level of compression which is described by the compression parameter $\theta$. $\sin \theta = V_{GS1}/V_{gs}$, where $V_{gs}$ is the amplitude of the input signal as shown in FIG. 2.

The absolute value of the gate potential should never exceed 0.4 V to avoid the gate current. If the forward bias gate current started to flow, the power losses and signal distortion would increase dramatically. This condition is represented by the equation: $V_{gs} < 0.4 + V_p$, where $V_p$ is the pinchoff voltage. Similarly the amplitude of the input signal should not exceed the breakdown voltage $V_{bd}$. $V_{gs} \leq V_{bd} - 2 - V_{dd} - V_p$ to avoid power losses.

This condition may be interpreted as the limitation on the maximum drain voltage. The output power is determined by the value of the supply voltage $V_{dd}$ as shown in FIG. 2. The breakdown voltage limitation is not significant for low bias voltage designs.

Two other sources of the power efficiency loss that should be accounted for are the resistive losses in the strip line and the losses due to turn-on voltage of the FET. The resistive losses in short (relative to wavelength) transmission lines are negligible. However, if the antenna is at a larger distance from the amplifier, a lower characteristic impedance should be used since it results in a wider, lower resistance strip line. Also, the power of the individual transistors should not be combined before transmission so the long transmission (strip) lines are connected in parallel. First, a separate antenna for each transistor can be used or the power can be combined close to the antenna.

The losses due to the nonideal switching characteristics of the FET may be expressed analytically. The maximum current amplitude $I_{dss}$ is decreased to a value Is (see FIG. 2) according to $I_s = I_{dss} Z_o/(R_{lin} + Z_o) V_{on} = I_s R_{lin}$ where $R_{lin}$ is the resistance of the MESFET in the linear region and $V_{on}$ is the FET turn-on voltage. Thus, the efficiency of amplifier decreases by $R_{lin}/(Z_o + R_{lin})$. For large power FETs, $R_{lin}$ is usually much smaller than $Z_o$ and the loss of efficiency is insignificant. At low bias current (in small transistors) and low bias voltage, the nonideal switching losses are significant.

Figure 4:
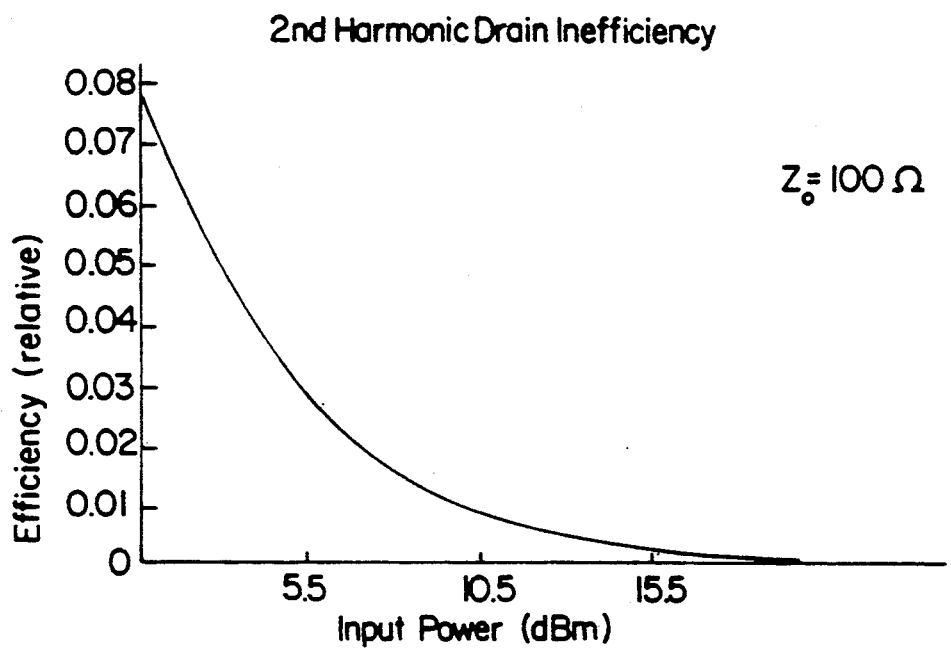
FIG. 4 is a graph of the efficiency of a FET amplifier as a function of input power for the second harmonic for an output impedance of 100 ohms.
Figure 5:
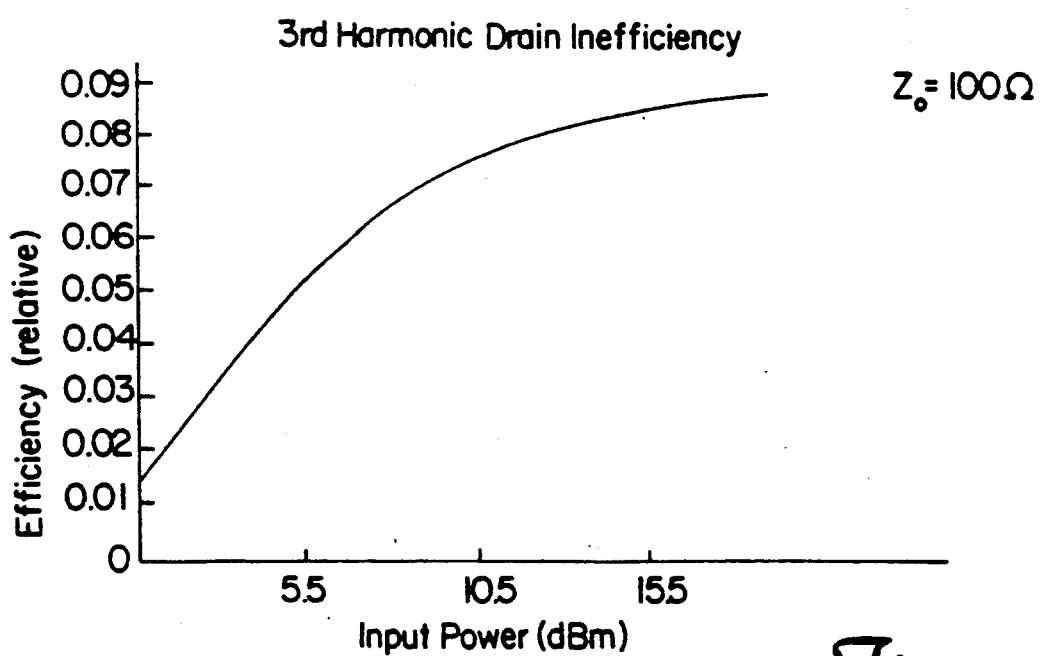
FIG. 5 is a graph revealing third harmonic drain efficiency of a FET amplifier as a function of input power for an output impedance of 100 ohms.

The first harmonic drain efficiency of FET 12 has a function of input power to amplifier 10, for an output impedance of FIG. 4 shows the second harmonic drain efficiency of amplifier 12 versus input power with an output impedance of 100 ohms. The third harmonic drain efficiency versus input power for amplifier 12 having an output impedance of 100 ohms is revealed in FIG. 5. These graphs were made under the assumption that the input and output of transistor 12 are perfectly matched and that the equations, $V_{gs} \leq 0.4 + V_p$ and $V_{gs} \leq V_{bd} - V_{dd} - V_p$, are satisfied. As an example, a HARRIS power MESFET HMF 0600 is assumed as FET 12, having parameters of $V_{bd} = 16$ V, $V_p = 3.5$ V, $I_{dso} = 0.65$ A, $R_{lin} = 0.6$ ohm, $g_m = 0.27$ A/V, $V_{dd} = 9$ V. For higher impedance, the compression occurs at lower input power. Increasing the current ($I_{dso}$) of MESFET improves the compression in the same manner as high output impedance, in accordance with $Z_o = V_{dd}/I_{dss}$ and $\sin \theta = V_{GS1}/V_{gs}$. The maximum drain efficiency obtained by the compression is 81%. Without the compression, the maximum drain efficiency is 50% (for class B amplifier). The compression also causes lower output power and lower gain. The power deterioration comes about since the full current swing of FET 12 is not utilized. The gain is compressed because the waveforms at the fundamental frequency are clipped at $V_{dd}$ or $I_{dss}$ levels. The output power and gain of amplifier 10 can be traded off against efficiency by using a large transistor 12 and biasing it so the compression is not excessive for given input power. The preferred way is to use several FETs as revealed in the invention.

Figure 6A:
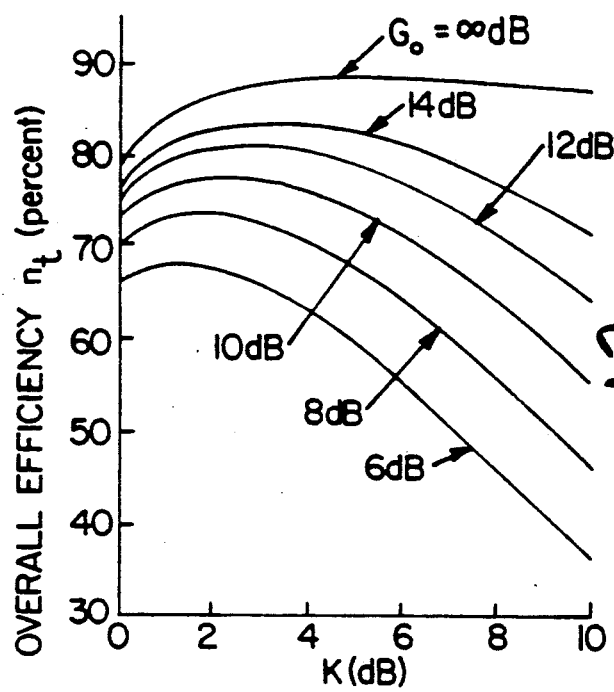
FIG. 6a is a graph showing an overdriven class B amplifier operation with overall efficiency versus $V_{gs}/V_{GS1}$ for various values of gain $G_o$.

The class B amplifier always exhibits some inefficiency caused by the power dissipated in the second, third and higher harmonics. The inefficiencies are revealed in FIG. 6a for the power compression conditions. FIG. 6a shows overall efficiency versus $V_{gs}/V_{GS1}$ for different values of gain (Go) for an overdriven class B amplifier. The present invention converts both second and third harmonics into the fundamental frequency signal. This is accomplished by injecting the harmonics back into the FET output. Due to FET nonlinearities, the harmonic signals are mixed with the fundamental frequency according to the following equations, $f_3 - f_2 = f_1$ and $f_2 - f_1 = f_1$, where $f_3$, $f_2$ and $f_1$ are third, second and fundamental frequencies, respectively. For the mixing of the frequencies to occur, the current signal must be injected back into the transistor or transistors. For this, the input signal of each transistor in amplifier 20 (of FIG. 7) must be shifted by 90 degrees in phase. More transistors may be combined to achieve higher power output. The harmonic signals from all transistors 12 are fed into and combined in one resonant circuit 22 and/or 24. The mixing is enhanced at each transistor 12 by having each transistor located at the current standing wave maximum of resonator 22 and/or 24. The coupling to resonators 22 and 24 is composed of narrow band pass couplers 26 and 28, respectively, designed specifically for second and third harmonics. Between the drain of each transistor 12 and the output of amplifier 20, a narrow band pass coupler 30 for the fundamental frequency is connected. Because of the combination of the harmonics from several transistors 12 in resonators 22 and 24, most of the harmonic energy is converted into the fundamental frequency of amplifier 20. Such conversion results in total drain efficiency reaching 90 per cent.

Figure 7:
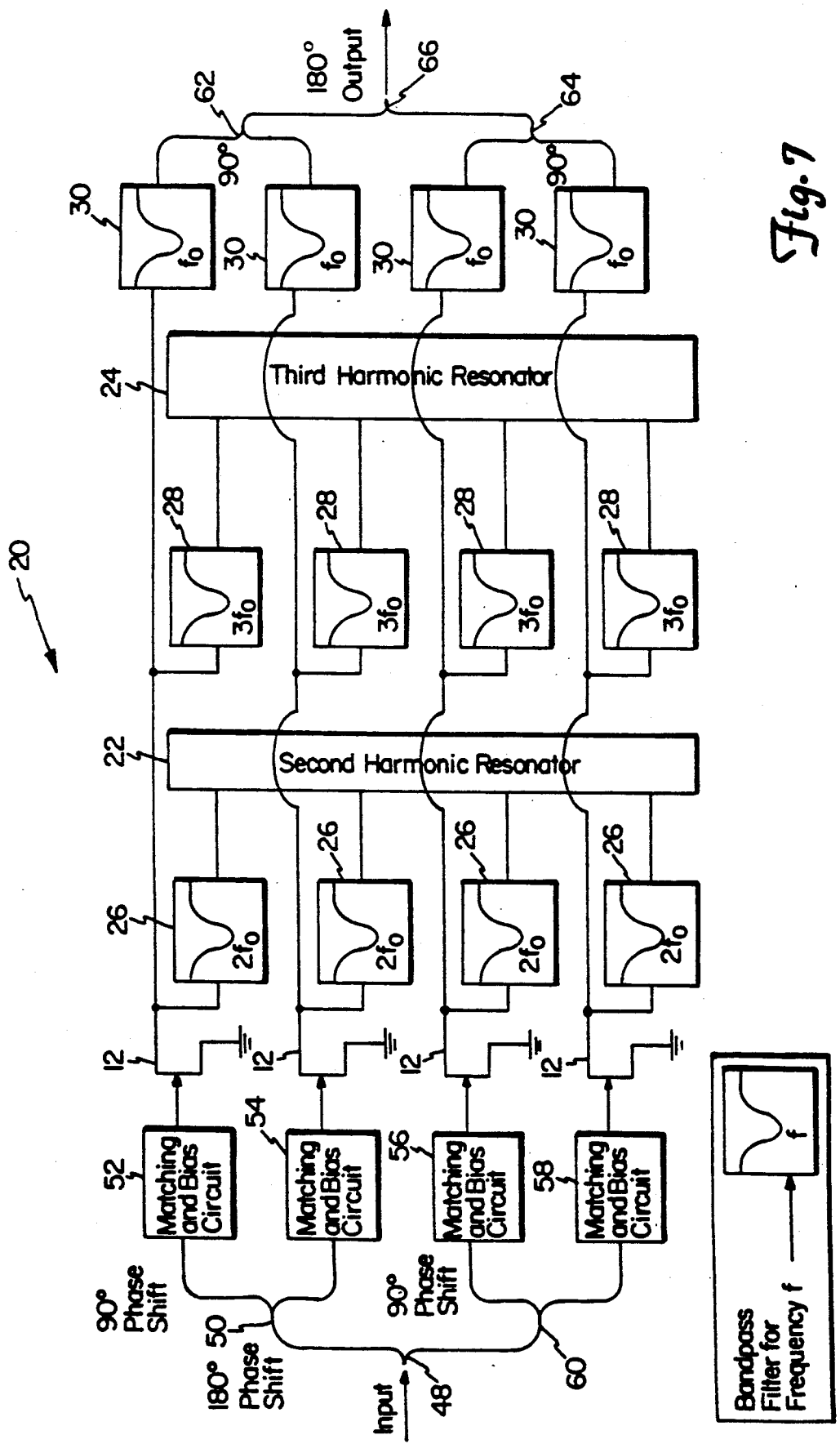
FIG. 7 is a schematic of a harmonic injection high efficiency amplifier.

The architecture for amplifier 20 in FIG. 7 is laid out to minimize size and resistance and/or radiative losses. The half-wavelength odd and even harmonic filters 28 and 26 respectively, are combined with one-wavelength oscillators. Approximately a nine square inch substrate at one GHz and 0.36 square inch substrate at 5 GHz are utilized for the architecture.

Figure 6B:
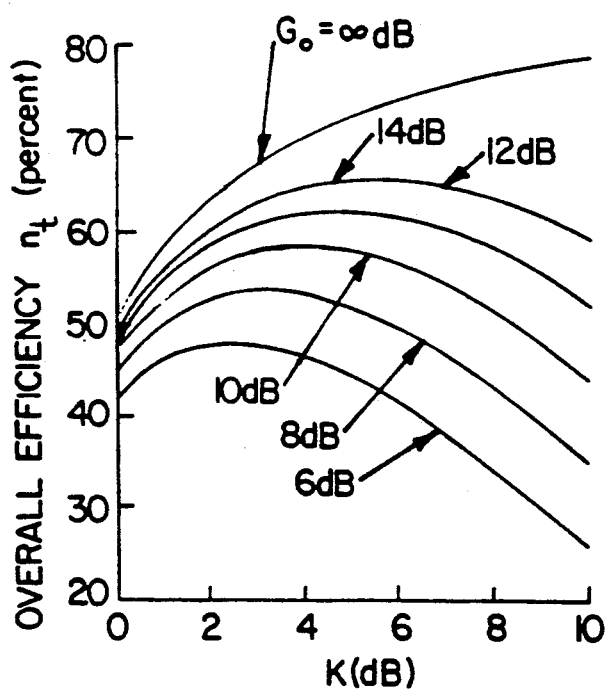
FIG. 6b is a graph for an overdriven class A amplifier showing overall efficiency versus $V_{gs}/V_{GS1}$ for various values of gain $G_o$.

The technique of increasing efficiency by down-converting high harmonics is most beneficial for the overdriven class A amplifier which is most suitable for a low voltage, battery operated systems. The harmonic content in an overdriven class A amplifier output is about two times greater than the harmonic content in the overdriven class B amplifier output. Thus, the efficiency increase with the present invention of down-converting higher harmonics could increase by more than 25 percent for the class A amplifier (see FIG. 6b).

In the situation where gain compression is not desired (e.g., amplitude-modulated signals), amplifier 20 may be designed so that no signal compression occurs. For such a design, mostly second harmonics would be generated, which would be down converted and mixed, to the fundamental frequency. In such an amplifier, the drain efficiency could exceed 50 percent.

As noted above, the output power of class A amplifier is greater than the output power of class B amplifier for a given bias. In particular, the output power of an overdriven class A amplifier is given by the equation, $P_A = V_{dd} I_s 8/\Pi^2$, and the output power of the overdriven class B amplifier (i.e., class F) is given by the equation, $P_B = V_{DD} I_s 4/\Pi^2$. The class A amplifier provides more power because both the current and voltage are forced above the DC biased conditions. The class B amplifier allows only for voltage to exceed the DC bias value. For the same reason, the efficiency of the class A amplifier is lower than the class B amplifier as revealed in FIGS. 6a and 6b. In summary, the highest efficiency is achieved with overdriven class B amplifiers. However, when the output power needs to be maximized at low voltage and current, the class A amplifier should be considered. The class A and B amplifier efficiencies are decreased by the power generated in the higher harmonics. The architecture in FIG. 7 of the present invention down-converts the high harmonic energy and thus results in an overall efficiency higher than that of a class F amplifier.

Figure 8:
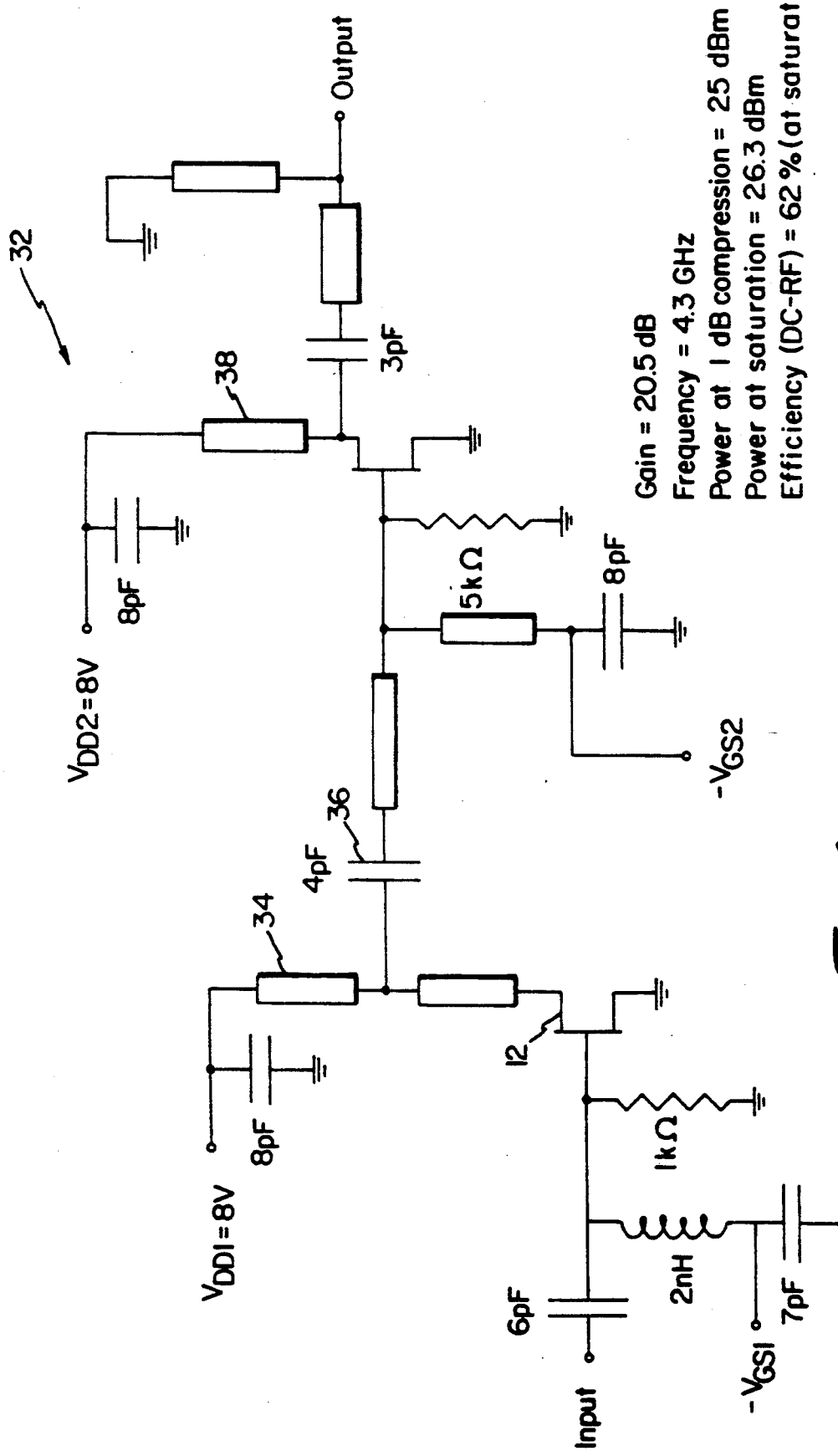
FIG. 8 is a schematic of a two stage high efficiency class F amplifier.

As stated above, proper harmonic termination is the basis for a high efficiency amplifier. FIG. 8 is an application of the present invention for attaining a high efficiency two-stage class F transmitter. The circuit starts out as a GaAs MESFET class AB amplifier designed and fabricated to operate at a frequency of 4.3 GHz with an efficiency of 62 percent. Having the second harmonic frequency output matched into a short circuit and the third harmonic into an open circuit, the resultant amplifier configuration 30 is referred as a class F even though the FET is biased into the class AB region of operation. The lengths of the transmission line segments (e.g., 34 and 38) in FIG. 8 depend on the type and size of the FETs (e.g., 12) being used. The lengths are selected to provide impedance matching throughout amplifier 32.

Figure 9:
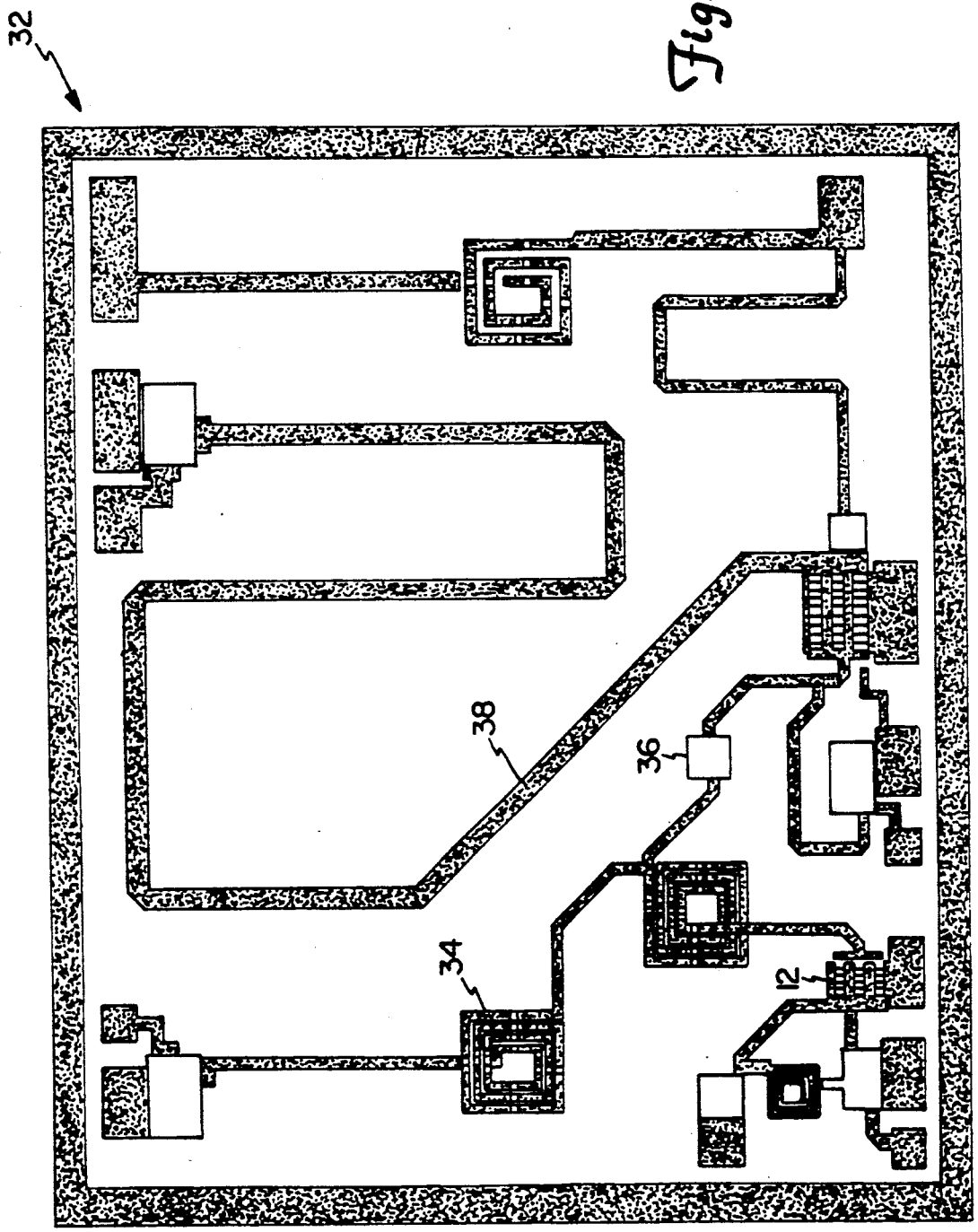
FIG. 9 is an integrated circuit lay-out diagram of a two stage high efficiency class F amplifier.

Sections of transmission lines, such as line 34, are shown as long rectangles. Transmission lines perform matching whereas capacitors, such as capacitor 36, decouple the DC bias lines. The layout configuration of the two stage amplifier of FIG. 8 is shown in FIG. 9. The capacitors are represented by white rectangles and the transmission line sections are shown as long black rectangles such as section 38. Some of the transmission lines have the shape of a spiral as in spiral 34 to reduce layout area and to provide enough transmission line length. The wavelength at 4.3 GHz GaAs substrate is equal to 20 millimeters which is about two times larger than the maximum size of a GaAs die. The latter size is limited by photolithography exposure equipment. Curved transmission lines introduce parasitic inductance and losses at the corners while decreasing the die size. Such parasitic effects decrease the performance of amplifier 32.

Figure 10:
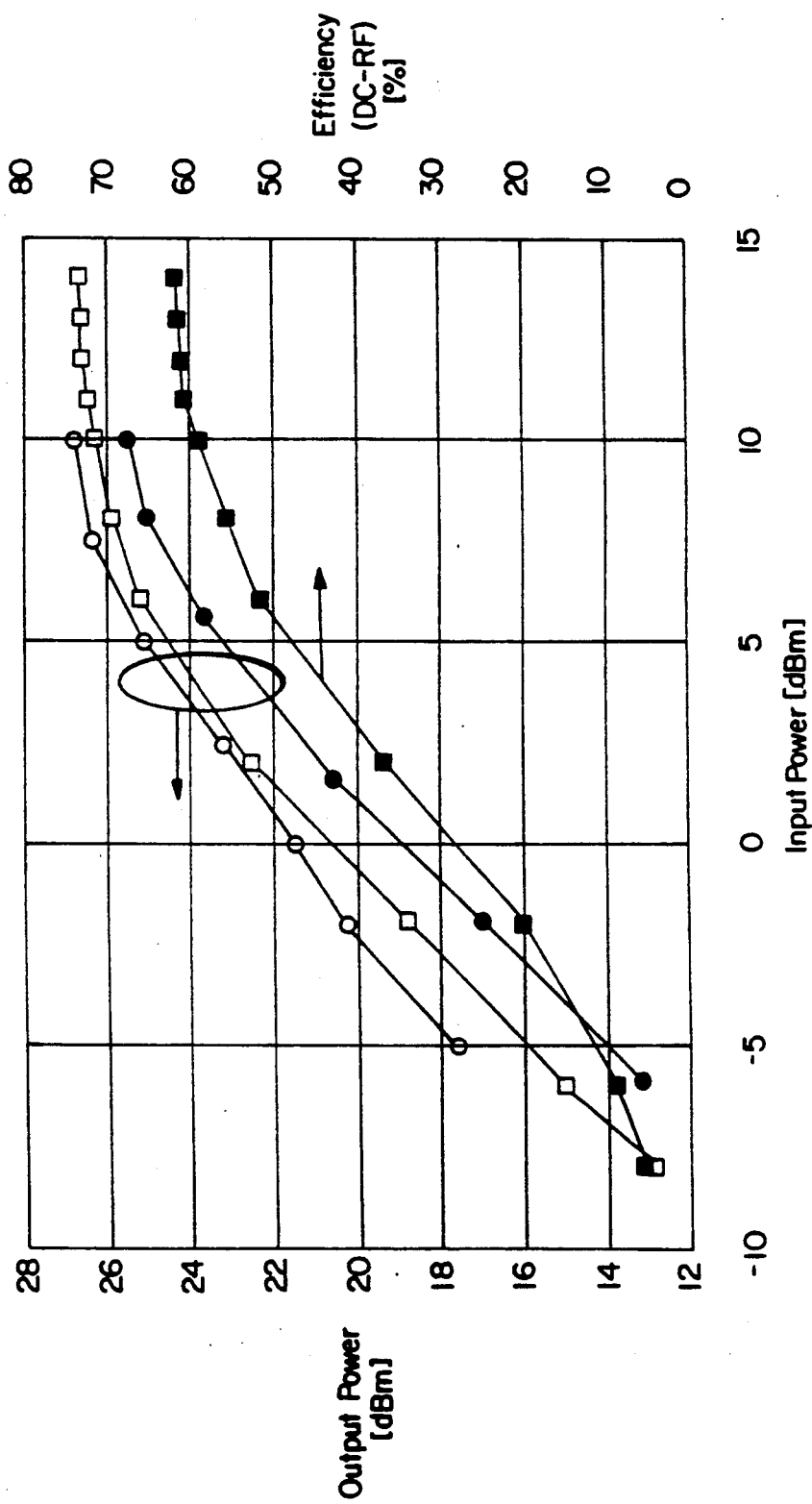
FIG. 10 is a graph of output power and efficiency versus input power for a two stage class F amplifier.

Three modes of operation are shown in FIG. 10, that is, a class A linear region, class F region and an overdriven (saturation) region. At a small input signal (below −3dBm), the transistor works in the A region, thus little harmonics are generated and the efficiency is small. However, when the input signal is large enough to generate a square-like waveform at the drain of the transistor 12, the efficiency rapidly increases because the current and voltage almost do not overlap (note FIG. 2 and the above-corresponding description). Finally, the input voltage exceeds the gate turn-on voltage as given in the equation $V_{gs} \leq 0.4 + E_p$. Then the energy flows through the gate Schottky barrier to ground and does not contribute to the output power. Consequently, the output power and efficiency cease to increase with the increase of input power in the right-sided portion of FIG. 10. In sum, FIG. 10 shows the output power and efficiency versus input power for an amplifier designed as a two stage class F state-of-the-art transmitter as shown in FIG. 8.

Figure 11:
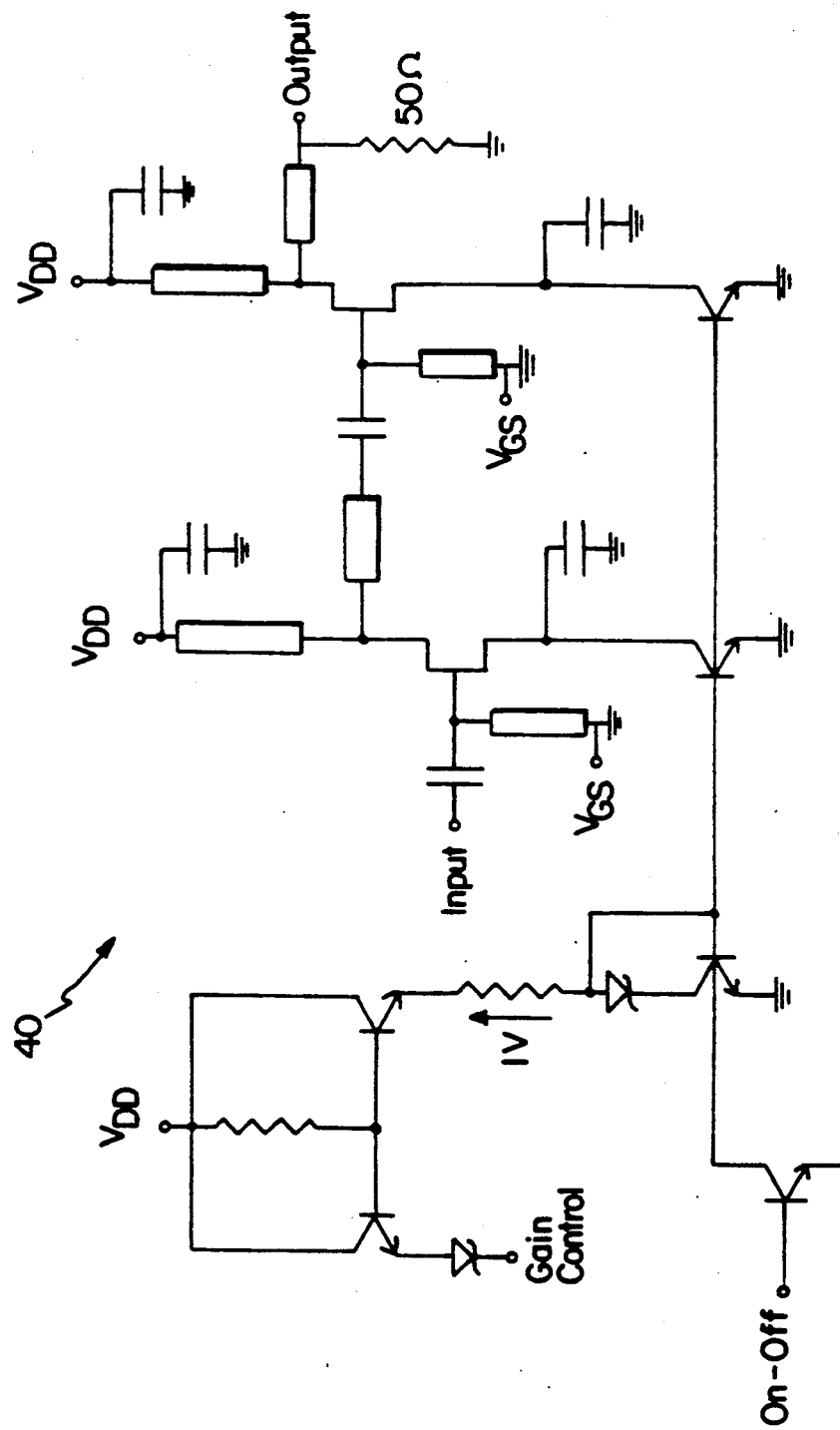
FIG. 11 is a schematic of a high efficiency voltage-controlled amplifier.

Another instance of a high efficiency, low supply voltage and current amplifier, that is, a high efficiency voltage controlled amplifier 40, is illustrated in FIG. 11. The amplifier utilizes harmonic matching techniques of the present invention. The high output power (i.e., 1.7 dBm relative to a DC supply of 2.4 volts and 1.3 microamps) reveals the utilization of high efficiency techniques of a present invention. However, class A operation is required so that the current and voltage flow through the device during two halves of the input cycle and thus provide more output power. As noted above, this mode of operation results in less efficiency than class AB or B operation. Harmonic frequency matching and down-converting techniques are utilized in either mode of operation for enhanced efficiency. Architecture of FIG. 11 compensates for nonideal switching and resistive losses. The other characteristic is a high gain of 21.7 dB at low bias current of 1.3 milliamps. The transistor gain is proportional to bias so the gain is low at low current. Because bipolar transistor gain is higher by a factor of 30 than MESFET gain, it is a preferred choice for amplifier 40. However, low cutoff frequencies of bipolar devices decrease the effective gain available at microwave frequencies. Increasing the number of amplifier stages per greater gain is not possible because of limited size and power constraints. The best choice here is short gate, heterojunction FET or heterojunction bipolar transistors (HBT). The small size of amplifier 40 is a limitation on the number of stages as well as the layout of matching structures. GaAs substrates are hybrid Ba substrates along with curved transmission lines, which are needed to achieve ultra small dimensions.

Tuneable attenuation may be achieved with a bipolar transistor bias control in FIG. 11. The pertinent bipolar transistor is operated in saturation so that the emitter-to-collector voltage is relatively small and that the bias is not decreased substantially. Such condition is critical because the supply voltage is only 2.4 volts. Further, the bias current needs to be controlled with an accuracy of 100 parts per million. This accuracy is achieved by utilizing a matched bipolar transistor current source and a temperature compensated circuit design of FIG. 11. Since 100 part-per-million stability implies 0.1 millivolt bias accuracy, a well-shielded design is necessary. A low bias current of 1.3 milliamps requires that custom small area devices need to be utilized. For instance, a GaAs MESFET with a gate size of 1×5 microns is appropriate. Typically, commercial amplifying transistors are designed for much higher bias current.

Requirements for good, high efficiency microwave amplifiers include high gain, high cut-off frequency, high turn-on voltage of Schottky gate and low FET turn-on voltage (at which the I-V curve saturates). Substrates need to have high dielectric contrast and low transmission line losses. The figure of merit (FOM) of a microwave amplifying device for operation at low supply voltage is high transconductance which is normalized with respect to the bias current. For a bipolar transistor, the figure of merit is equal to $1/V_{th} = 38$ $1/V$ where $V_{th}$ is the thermal voltage 0.026 volts. For a GaAs MESFET, the figure a merit is equal to $2/(V_{GS} = V_p) \approx 5$, where $V_{GS} - V_p$ is the difference between the gate bias voltage and the pinch-off (threshold voltage) of the device. Usually, the voltage should be at least 0.4 volts to attain maximum gain. The transconductance ($g_m$) dependence on gate-source bias which is more square-shaped implies smaller $V_{GS}-V_p$ difference in higher FOM.

Figure 12A:
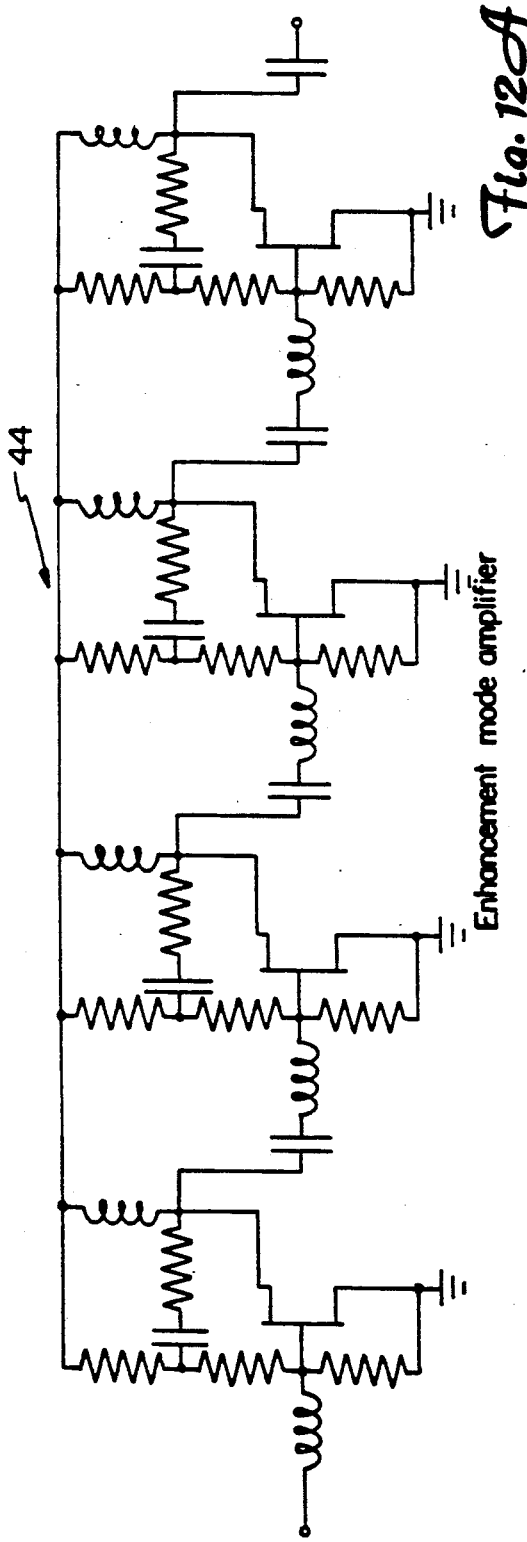
FIG. 12a is a schematic of an S-band enhancement mode amplifier.
Figure 12B:
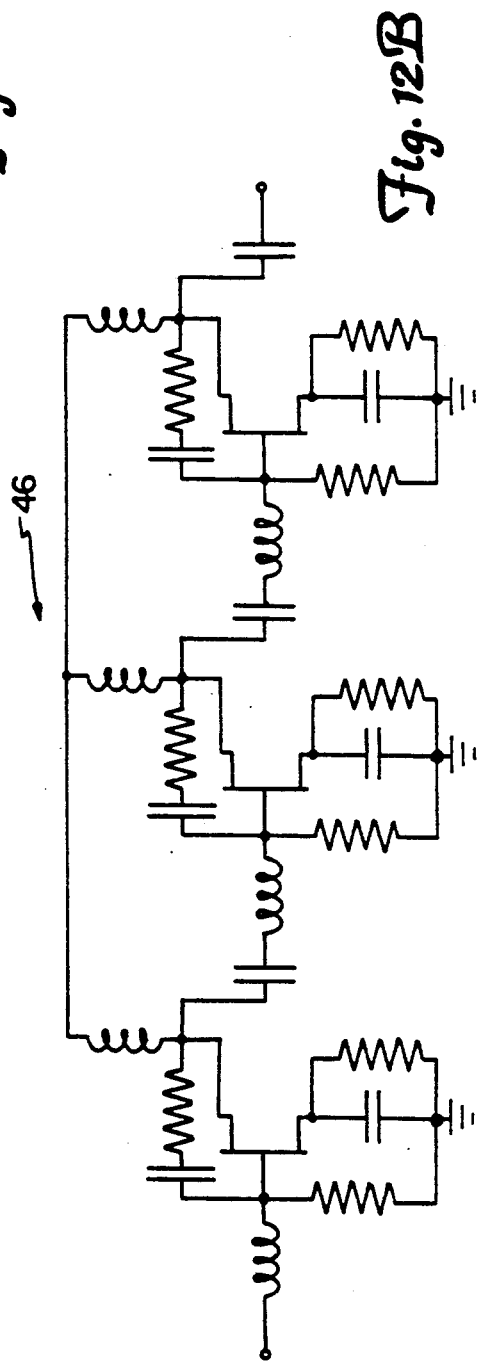
FIG. 12b is a schematic of an S-band depletion mode self-biased amplifier.

A bipolar transistor delivers more gain at a limited current supply than a FET. It is easier to broadband match a bipolar transistor than a FET since the input quality factor of a FET is five times lower than a bipolar transistor. However, the silicon bipolar transistor cutoff frequency is lower than a FET cutoff frequency for the same high gain and output power. Silicon bipolar transistors can be used up to 10 GHz. For higher frequencies, the heterojunction bipolar transistors and compound semiconductor FETs having mushroom gates (to decrease gate resistance), shorter than 0.5 microns, are desired. Large signal operation of transistors is necessary for large output power. Thus, transistor gain should be constant over a wide range of input voltages. Bipolar transistors and heterojunction Indium-based FETs maintain high gain over a wide range of input voltages. High gain at low output current can be achieved with an enhancement mode MESFET as compared with a depletion mode MESFET since the charge in the channel is close to the gate. FIGS. 12a and b show equivalent S-band amplifier topologies, utilizing enhancement mode and depletion mode FETs, respectively. In FIG. 12b, a three stage depletion mode MESFET amplifier 46 provided 30 dB gain and dissipated 150 milliwatts at 5 volts. Amplifier 46 may be used as a base line. Then the depletion mode FETs were substituted with enhancement mode FETs running at 2.5 volts at 1.5 milliamps per stage. Four stages were required to provide 30 dB of gain at 3 GHz. However, in the resultant amplifier 44 of FIG. 13a, the total power dissipation was 15 milliwatts, a ten-fold reduction in power dissipation. The power dissipation reduction was due to a ten-fold reduction in output power. Thus, an enhancement mode device amplifier 44 can offer substantial power savings over a depletion mode device amplifier 46 at low microwave frequencies and low output levels.

Transistor efficiency, especially at low bias voltage, is decreased by an excessive FET turn-on voltage as revealed by the following equation, $V_{on}=I_s \times R_{lin}$, where $R_{lin}$ is the resistance of the FET in the linear region and $V_{on}$ is the FET turn-on voltage. The turn-on voltage of a bipolar transistor is in the range of 0.2 to 0.4 volts (which is mostly dependent upon band structure and doping level). The typical turn-on voltage of a FET varies from 0.5 to 1 volt and depends on gate bias, electron saturation velocity and source-to-drain distance. The Indium-based pseudomorphic and lattice-matched FET has a smaller turn-on voltage than a GaAs FET because of high electron saturation velocity.

Substrate (hybrid) technology affects the size of high efficiency amplifiers. Since the matching strip lines are about one-half wavelength long, the device dimension is determined by the effective wavelength at a given frequency. Thus, a high dielectric constant of the substrate is preferable. The wavelength on a Ba TET substrate (having a dielectric constant=20) and a GaAs substrate (having a dielectric constant=13) is 0.5 inch and 0.6 inch, respectively, at 5 GHz. Layout dimensions of the substrate can be further decreased by using crossbar transmission lines or spiral structures as illustrated in FIG. 9.

In sum, present invention utilizes the down conversion of harmonic energy for increased efficiency. Further, heterojunction bipolar transistors and/or mushroom gate Indium-based heterostructure transistors can function at low bias voltage and current, thereby providing the needed gain in output power with adequate efficiency. The small size of the circuit, needed for attaining output power levels at desired gains and efficiencies, is achieved with high dielectric constant substrates and compact layouts of transmission lines.

The present invention is represented by FIG. 7. The input first comes into power splitter and phase shifter 48 which splits the input signal into two signals which continue on separate paths but are separated by an 180 degree phase shift. The phase shifted signal enters power splitter and phase shifter 50 which splits the signal into two signals of equal amplitude, however, 90 degrees out of phase with respect to each. A 90 degree phase-shifted signal goes on to impedance matching and bias circuit 52 and the other signal from splitter 50 of the same amplitude goes on to impedance matching and bias circuit 54. The counterpart signal to the 180 degree phase-shifted signal from power splitter 48 goes on to power splitter and phase shifter 60. From splitter 60 comes signals of equal amplitude and having a phase difference of 90 degrees. The 90 degree phase-shifted signal goes on to impedance matching and bias circuit 56 and the other signal of equal amplitude from splitter 60 goes on to impedance matching and bias circuit 58. The signals from circuits 52, 54, 56 and 58 go on to separate FETs 12, respectively. FETs 12 are nonlinear amplification elements. The nonlinearity of such elements is the basis for the inefficiency which amplifier 20 design greatly reduces to improve the efficiency of the overall amplifier. Of course, if FETs 12 were a linear amplification elements, the efficiency of such amplifiers would not be a problem here. The drains of transistors 12 are connected individually, respectively, to second harmonic band pass filters 26. The outputs of band pass filters 26 are connected to a second harmonic resonator 22. Resonator 22 is designed to provide voltage minimums to each transistor 12 terminal. Harmonic resonator 22 leads to high harmonic amplitude thereby increasing frequency down-conversion efficiency. Drain terminals of transistors 12 are also each respectively connected to third harmonic band pass filters 28. The outputs of band pass filters 28 are connected to a third harmonic resonator 24 which is designed to provide voltage minimums at each transistor, increase the harmonic signal amplitude and increase the frequency down-conversion efficiency. For highest efficiency, transistors 12 should be driven in the gain compression region of operation. The power losses due to linear FET characteristic region and the break down voltages are minimized by the choice of power FET 12 and bias voltage conditions. Functionally, the third and second harmonics generated by transistors operating in class B or like modes are down converted back to the fundamental frequency thereby increasing the efficiency of the operation of amplifier 20. The drains of transistors 12 are each connected to fundamental frequency band pass filters 30, respectively. The outputs of the first pair of filters 30 are combined in power combiner 62. The outputs of band pass filters 30 are 90 degrees out of phase and are brought into phase by power combiner 62 resulting in a combined signal of greater amplitude that goes to power combiner 66. The outputs of the second pair of band pass filters 30, which are 90 degrees out of phase with respect to each other, are combined and phase shifted into the same phase and a higher amplitude signal by power combiner 64. The outputs of combiners 62 and 64 are 180 degrees out of phase and are combined by power combiner and phase shifter 66. The 180 degree phase-shifted signal from power combiner 62 and the non-phase-shifted signal of power combiner 64 are brought into phase with each other by combiner 66 resulting in a high amplitude fundamental frequency output of high efficiency amplifier 20. Second harmonics are reflected back from resonator 22 and are mixed in a down-conversion mode at each FET 12. Fundamental frequency band pass filters 30 may be removed and substituted with one fundamental frequency band pass filter 30 at a point after the output of power combiner 66.

Figure 13:
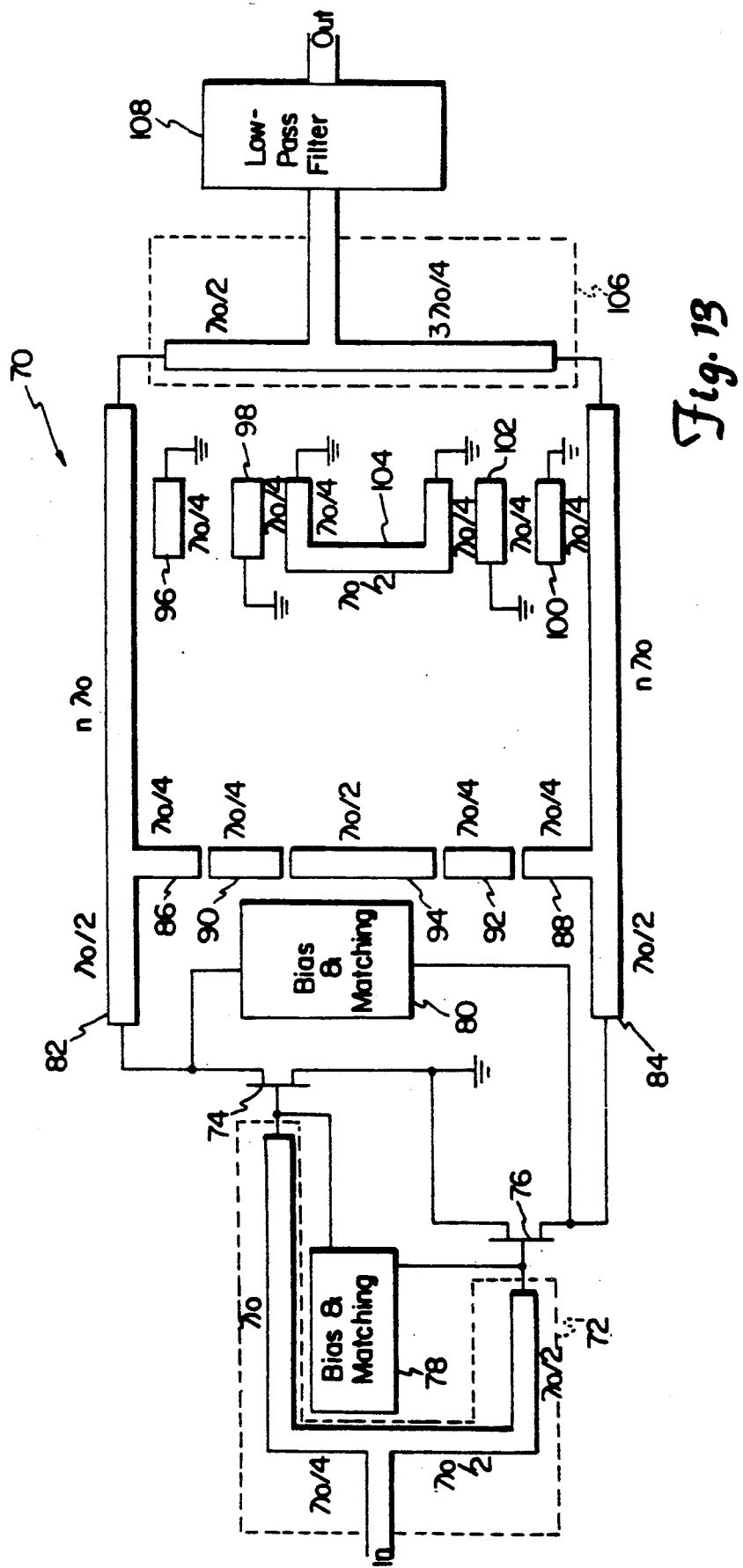
FIG. 13 is a microstrip waveguide embodiment of the present invention.

A microstrip waveguide implementation of the present invention is shown in FIG. 13 as amplifier 70. Amplifier 70 has an input into a power combiner and signal shifter 72. Combiner 72 has two microstrip waveguides of wavelengths $\lambda_o/4 + \lambda_o$ and $\lambda_o/2 + \lambda_o/2$, respectively, resulting in two signals of equal amplitude but 90 degrees out of phase with respect to each other. $\lambda_o$ is the wavelength of the fundamental frequency. The 90 degree phase-shifted signal is input into FET 74 and the nonshifted-phase signal is input into FET 76. The gates of FETs 74 and 76 are connected to a bias matching circuit 78 which is to maintain equivalent biases on FETs 74 and 76. The sources of gates 74 and 76 are connected to a ground plate. A second bias in matching circuit 80 is connected to the drains of FETs 74 and 76. The drains of FETs 74 and 76 are also connected to strips 82 and 84, respectively. On strips 82 and 84, at a distance of $\lambda_o/2$ from the drain connections to FETs 74 and 76, respectively, are $\lambda_o/4$ microstrip protrusions 86 and 88. At a small gap from strip 86, is another strip 90 in the same direction having a length of $\lambda_o/4$, which functions as a second harmonic signal coupler. At a short gap from strip 88, is a $\lambda_o/4$ strip 92 lying in the same direction as strip 88, which functions as a second harmonic coupler. Between and aligned with strips 90 and 92 is a strip 94 of a length of $\lambda_o/2$ which functions as a second harmonic resonator. Strips 82 and 84 extend in length for $n\lambda_o$ where n is an integer. Situated down strip 82, but before the full length of the $n\lambda_o$ portion of strip 82, and situated close and parallel to strip 82 is a strip 96 having a $\lambda_o/4$ length and grounded at an end in the direction away from the transistor 74 connection to strip 82. Parallel to and adjacent to strip 96, but not touching strip 96, is strip 98 having a length of $\lambda_o/4$ and being grounded at an end towards the FET 74 connection to strip 82. Parallel to strip 84, at a point along the $n\lambda_o$ portion, at a distance from the connection of FET 76 which is the same as the distance from the connection of FET 74 to strip 82, to strip 96, is a strip 100 having a length of $\lambda_o/4$ and being adjacent and parallel to but not touching strip 84. Strip 100 is grounded at the end away from the direction of the connection of strip 84 to transistor 76. Another strip 102, which is parallel and adjacent to strip 100, also has the length of $\lambda_o/4$ and is grounded on the end in the direction of the connection of FET 76 to strip 84. Between strips 98 and 102, there exists a horseshoe shaped strip 104 having squarish corners. This strip 104 has $\lambda_o/4$ legs that are parallel but adjacent to, but not touching strips 98 and 102, respectively. A closed part of strip 104 that connects the ends of the legs of strip 104 is parallel to strip 94 and has a length of $\lambda_o/2$. The open end of strip 104 faces away from the direction of strip 94. The ends of strip 104 are grounded. Strips 96 and 98 and strips 100 and 102 function as third harmonic signal couplers to strip 104. Strip 104 is a third harmonic resonator. On the far ends of strips 82 and 84, away from the connections of FETs 74 and 76, to strips 82 and 84 is connected power combiner and phase shifter 106. Phase shifter 106 is a T-type strip having a $\lambda_o/2$ leg connected to strip 82 and having a $3\lambda_o/4$ strip connected to strip 84. The other ends of the $\lambda_o/2$ and $3\lambda_o/4$ strips are connected together and are connected to an output strip at a T connection which make up combiner 106. The signal from strip 84 is phase shifted 90 degrees relative to the signal from strip 82 and then combined to be in phase with combined amplitudes of the respective signals as an output of power combiner 106. The output of power combiner 106 goes through a fundamental frequency band pass filter 108. The output of filter 108 is the output of amplifier 70.

Amplifier 70 may be stacked up to result in a four FET total amplifier for higher power. Particular amplifier 70 in FIG. 13 has a $\lambda_o$ of 1.66 millimeters and is set on a GaAs substrate design for 5 GHz having a die size of $2 \times 7$ millimeters. The stacked structure of two amplifiers 70 for higher power utilizes a die size of $4 \times 7$ millimeters.

Amplifier 70 of FIG. 13 may be an optical amplifier wherein devices 74 and 76 are optical amplifying elements and strips 72, 82, 84, 86, 88, 90, 92, 94, 96, 98, 100, 102, 104 and 106 are optical waveguides. Also, items 78, 80 and 108 may be optical devices for matching and filtering, respectively.

I claim:
1. A harmonic injection amplifier comprising:
a signal splitter having an input and first and second outputs;
a first phase shifter having an input connected to the first output of said signal splitter, and having an output;
a first transistor having an input connected to the output of said first phase shifter and having an output;
a second transistor having an input connected to the second output of said signal splitter;
a first filter having a first terminal input connected to the output of said first transistor and having a second terminal;
a second filter having a first terminal connected to the output of said second transistor and having a second terminal;
a first resonator having a first terminal connected to the second terminal of said first filter and having a second terminal connected to the second terminal of said second filter;
a third filter having a first terminal connected to the output of said first transistor and having a second terminal;
a fourth filter having a first terminal connected to the output of said first transistor and having a second terminal;
a second resonator having a first terminal connected to the second terminal of said third filter and having a second terminal connected to the second terminal of said fourth filter;
a second phase shifter having an input connected to the output of said first transistor and having an output;
a signal combiner having a first input connected to the output of said second phase shifter and a second input connected to the output of said second transistor, and having an output; and a fifth filter having a first input connected to the output of said signal combiner and having an output.

2. Amplifier of claim 1 wherein:

said first and second filters are band pass filters of second harmonic signals;

said third and fourth filters are band pass filters of third harmonic signals;

said first resonator is a second harmonic resonator;

said second resonator is a third harmonic resonator; and said fifth filter is a band pass filter of fundamental frequency signals.

3. Amplifier of claim 2 wherein:

said first phase shifter shifts a signal about ninety degrees; and said second phase shifter shifts a signal about ninety degrees.

4. Amplifier of claim 3 further comprising:

a first impedance matching circuit connected to the input of said first transistor; and a second impedance matching circuit connected to the input of said second transistor.

5. A harmonic injection amplifier comprising:

amplification means for amplifying signals of a fundamental frequency;

first filter means, connected to said amplification means, for band passing a plurality of harmonics of the signals;

resonator means, connected to said filter means, for resonating the plurality of harmonics for injection in said amplification means and downconverting to signals of the fundamental frequency; and second filter means, connected to said amplification means, for band passing signals of the fundamental frequency.

6. A harmonic injection high efficiency amplifier comprising:

input means for receiving input signals;

power splitting and phase shifting means, connected to said input means and having first and second outputs, for splitting an input signal into first and second signals being about 90 degrees out of phase with respect to each other;

first transistor means, having an input connected to the first output of said power splitting and phase shifting means and having an output, for amplifying signals to the input of said first transistor means;

second transistor means, having an input connected to the second output of said power splitting and phase shifting means and having an output, for amplifying signals to the input of said second transistor means;

first band pass filter means, having an input connected to the output of said first transistor means and having an output, for band passing second harmonics of a signal from the output of said first transistor means;

second band pass filter means, having an input connected to the output of said second transistor means and having an output, for band passing second harmonics of a signal from the output of said second transistor means;

first resonating means, connected to the outputs of said first and second band pass filter means, for resonating second harmonics;

third band pass filter means, having an input connected to the output of said first transistor means and having an output, for band passing third harmonics of a signal on the output of said first transistor means;

fourth band pass filter means, having an input connected to the output of said second transistor means and having an output, for passing third harmonics of a signal on the output of said second transistor means;

second resonating means connected to the outputs of said third and fourth band pass filter means, for resonating the third harmonics from said third and fourth band pass filter means;

fifth band pass filter means, having an input connected to the output of said first transistor means and having an output, for band passing the fundamental frequency of a signal on the output of said first transistor means;

sixth band pass filter means, having an input connected to the output of said second transistor means and having an output, for band passing of the fundamental frequency of a signal on the output of said second transistor means; and power combining and phase shifting means, having a first input connected to the output of said fifth band pass filtering means and having a second input connected to the output of the sixth band pass filtering means, for bringing signals from the outputs of fifth and sixth band pass filtering means into phase with each other and combining the signals into one output signal.

7. Amplifier of claim 6 further comprising:

second power splitting and phase shifting means, having an input and first and second outputs, for power splitting an input signal into first and second signals at the first and second outputs, respectively, and for providing about a 90 degree phase shift between the first and second signals;

third transistor means, having an input connected to the first output of said second power splitting and phase shifting means and having an output, for amplifying a signal at the input;

fourth transistor means, having an input connected to the second output of said second power splitting phase shifting means and having an output, for amplifying a signal at the input;

seventh band pass filter means, having an input connected to the output of said third transistor means and having an output connected to said first resonating means, for band passing the second harmonics of a signal on the output of said third transistor means;

eighth band pass filter means, having an input connected to the output of said fourth transistor means and having an output connected to said first resonating means, for band passing second harmonics of a signal on the output of said fourth transistor means;

ninth band pass filer means, having an input connected to the output of said third transistor means and having an output connected to said second resonating means, for band passing third harmonics of a signal on the output of said third transistor means;

tenth band pass filter means, having an input connected to the output of said fourth transistor means and having an output connected to said second resonating means, for band passing third harmonics of a signal on the output of said fourth transistor means;

eleventh band pass filter means, having an input connected to the output of said third transistor means and having an output, for band passing fundamental frequencies of a signal on the output of said third transistor means; 'twelfth band pass filter means, having an input connected to the output of said fourth transistor means and having an output, for passing fundamental frequencies of a signal on the output of said fourth transistor means;

second power combining and phase shifting means, having a first input connected to the output of said eleventh band pass filtering means and a second input connected to said twelfth band pass filtering means and having an output, for combining signals from said eleventh and twelfth band pass filter means and phase shifting one of the signals 90 degrees with respect to the other signal;

third power splitting and phase shifting means, having a first output connected to the input of the first power splitting and phase shifting means, having a second output connected to the input of the second power splitting and phase shifting means and having an input, for power splitting a signal at the input into first and second signals and for phase shifting one signal about 180 degrees with respect to the other signal; and third power combining and phase shifting means, having a first input connected to the output of said first power combining and phase shifting means, having a second input connected to the output of said second power splitting and phase shifting means and having an output, for combining signals on first and second inputs and phase shifting about 180 degrees a signal on one of the inputs with respect to a signal on the other input so that the two signals are in phase with respect to each other.

8. Amplifier of claim 7 further comprising:

first matching and bias means having an input connected to the first output of said first power splitting and phase shifting means and having an output connected to the input of said first transistor means, for matching and bias adjusting of a signal to the input of said first transistor means;

second matching and bias means, having an input connected to the second output of said first power splitting and phase shifting means and having an output connected to said second transistor means, for matching and bias adjusting a signal to the input of said second transistor means;

third matching and bias means, having an input connected to the first output of said second power splitting and phase shifting means and having an output connected to the input of said third transistor means, for matching and bias adjusting a signal to the input of said third transistor means; and fourth matching and bias means, having an input connected to the second output of said second power splitting and phase shifting means and having an output connected to the input of said fourth transistor means, for matching and bias adjusting of a signal to the input of said fourth transistor means.

9. A harmonic injection high efficiency amplifier comprising:

an input terminal;

a $5\lambda_o/4$-length microstrip having a first end connected to said input terminal and having a second end;

a $\lambda_o$-length microstrip having a first end connected to said input terminal and having a second end;

a first transistor having an input connected to the second end of said $5\lambda_o/4$-length microstrip and having an output;

a second transistor having an input connected to the second end of said $\lambda_o$-length microstrip and having an output;

a first $\lambda_o/2$-length microstrip having a first end connected to the output of said first transistor and having a second end;

a second $\lambda_o/2$-length microstrip having a first end connected to the output of said second transistor and having a second end;

a first $\lambda_o/4$-length microstrip having a first end connected to the second end of said first $\lambda_o/2$-length microstrip and having a second end;

a second $\lambda_o/4$-length microstrip having a first end in close proximity to the second end of said first $\lambda_o/4$-length microstrip and having a second end;

a third $\lambda_o/2$-length microstrip having a first end in close proximity to the second end of said second $\lambda_o/4$-length microstrip and having a second end;

a third $\lambda_o/4$-length microstrip having a first end in close proximity to the second end of said third $\lambda_o/2$-length microstrip and having a second end;

a fourth $\lambda_o/4$-length microstrip having a first end in close proximity to the second end of said third $\lambda_o/4$-length microstrip and having a second end connected to the second end of said second $\lambda_o/2$-length microstrip;

a first $n\lambda_o$-length microstrip having a first end connected to the second end of said first $\lambda_o/2$-length microstrip and having a second end;

a second $n\lambda_o$-length microstrip having a first end connected to the second end of said second $\lambda_o/2$-length microstrip and having a second end;

a fifth $\lambda_o/4$-length microstrip in close proximity and approximately parallel to said first $n\lambda_o$-length microstrip, having a first end connected to a common ground and having a second end situated closer to the first end of said first $n\lambda_o$-length microstrip than the first end of said fifth $\lambda_o/4$-length microstrip;

a sixth $\lambda_o/4$-length microstrip, in close proximity and approximately parallel to said fifth $\lambda_o/4$-length microstrip, having a first end connected to the common ground and having a second end that is closer to the second end of said first $n\lambda_o$-length microstrip;

a seventh $\lambda_o/4$-length microstrip, in close proximity and approximately parallel to said second $n\lambda_o$-length microstrip, having a first end connected to the common ground and having a first end that is closer to the first end of said second $n\lambda_o$-length microstrip than the first end of said seventh $\lambda_o/4$-length microstrip;

an eighth $\lambda_o/4$-length microstrip, in close proximity and approximately parallel to said seventh $\lambda_o/4$-length microstrip, having a first end connected to the common ground and having a second end closer to the second end of said second $n\lambda_o$-length microstrip than the first end of said eighth $\lambda_o/4$-length microstrip;

a ninth $\lambda_o/4$-length microstrip, in close proximity and approximately parallel to said sixth $\lambda_o/4$-length microstrip, having a first end connected to the common ground and having a second end closer to the first end of said $n\lambda_o$-length microstrip than the first end of said ninth $\lambda_o/4$-length microstrip;

a tenth $\lambda_o/4$-length microstrip, in close proximity to and approximately parallel to said eighth $\lambda_o/4$-length microstrip, having a first end connected to the common ground and having a second end closer to the first end of said $n\lambda_o$-length microstrip than the first end of said tenth $\lambda_o/4$-length microstrip;

a fourth $\lambda_o/2$-length microstrip having a first end connected to the second end of said ninth $\lambda_o/4$-length microstrip and having a second end connected to the second end of said tenth $\lambda_o/4$-length microstrip;

a fifth $\lambda_o/2$-length microstrip having a first end connected to the second end of said first $n\lambda_o$-length microstrip and having a second end;

a $3\lambda_o/4$-length microstrip having a first end connected to the second end of said second $n\lambda_o$-length microstrip and having a second end connected to the second end of said fifth $\lambda_o/2$-length microstrip; and an output terminal connected to the second end of said fifth $\lambda_o/2$-length microstrip and to the second end of said $3\lambda_o/4$-length microstrip; and wherein:
$\lambda_o$ is a wavelength of the fundamental frequency of a signal; and
n is an integer multiple.

10. Amplifier of claim 9 further comprising:
a band pass filter for passing the signal of wavelength $\lambda_o$, having an input connected to said output terminal and having an output; and wherein:
$\lambda_o$ is a wavelength of the fundamental frequency of the signals;
said third $\lambda_o/2$-length microstrip functions as a second harmonic resonator; and
said ninth $\lambda_o/4$-length microstrip, tenth $\lambda_o/4$-length microstrip and fourth $\lambda_o/2$-length microstrip function as a third harmonic resonator.

* * * * *